United States Patent
Okazaki

(10) Patent No.: US 7,075,116 B2
(45) Date of Patent: Jul. 11, 2006

(54) SEMICONDUCTOR LIGHT EMITTING DEVICE

(75) Inventor: Tadahiro Okazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 119 days.

(21) Appl. No.: 10/764,514

(22) Filed: Jan. 27, 2004

(65) Prior Publication Data

US 2004/0183085 A1   Sep. 23, 2004

(30) Foreign Application Priority Data

Jan. 27, 2003 (JP) .............................. 2003-017098

(51) Int. Cl.
*H01L 33/00* (2006.01)

(52) U.S. Cl. .......................... 257/98; 257/99; 257/100

(58) Field of Classification Search .......... 257/79–103; 372/43–50
See application file for complete search history.

(56) References Cited

U.S. PATENT DOCUMENTS

| | | | | |
|---|---|---|---|---|
| 6,084,250 A | * | 7/2000 | Justel et al. | 257/89 |
| 6,245,259 B1 | * | 6/2001 | Hohn et al. | 252/301.36 |
| 6,469,323 B1 | * | 10/2002 | Nakamura et al. | 257/94 |
| 2002/0030197 A1 | * | 3/2002 | Sugawara et al. | 257/103 |
| 2004/0104391 A1 | * | 6/2004 | Maeda et al. | 257/79 |

FOREIGN PATENT DOCUMENTS

| | | | |
|---|---|---|---|
| JP | 60012782 A | * | 1/1985 |
| JP | 2002-176201 | | 6/2002 |
| JP | 2002-226846 | | 8/2002 |
| JP | 2002-241586 | | 8/2002 |
| JP | 2002-335010 | | 11/2002 |

* cited by examiner

*Primary Examiner*—Johannes P. Mondt
(74) *Attorney, Agent, or Firm*—Rabin & Berdo P.C.

(57) ABSTRACT

An ultraviolet ray emitting element, a blue color converting layer containing a blue color light emitting fluorescent material that is excited by ultraviolet rays and emits blue light, a green color converting layer as the same and a red color converting layer as the same are prepared, and the blue color converting layer, the green color converting layer and the red color converting layer are stacked on the ultraviolet ray emitting element in this order. Consequently, it is possible to easily obtain white light that has high color rendering properties. In order to obtain white color that exerts high color rendering properties, the average particle sizes of the fluorescent materials are preferably made greater in the order of the blue color light emitting fluorescent material, the green color light emitting fluorescent material and the red color light emitting fluorescent material.

16 Claims, 2 Drawing Sheets

SEMICONDUCTOR LIGHT EMITTING DEVICE

FIELD OF THE INVENTION

The present invention relates to a semiconductor light emitting device, and more particularly relates to a white color semiconductor light emitting device that is provided with an ultraviolet ray light emitting element and a fluorescent material layer.

BACKGROUND OF THE INVENTION

In some of conventional white color semiconductor light emitting devices, a layer containing a fluorescent material, such as yttrium-aluminum-garnet (YAG) activated by adding cerium, that absorbs blue light and emits yellow light is formed on a light emitting surface of a blue color semiconductor light emitting element, and blue color emitted from the semiconductor light emitting element and yellow color emitted from the above-mentioned fluorescent material layer are mixed with each other to form white color.

In such a semiconductor light emitting device, however, since white color is made by mixing blue color and yellow color with each other, the color rendering properties of the emitted color are not high. Therefore, for example, JP-A No. 2002-226846 has proposed a semiconductor light emitting device which is provided with a light emitting element that emits near ultraviolet rays and a film including four fluorescent materials that are respectively excited by the near ultraviolet rays to emit red, orange, blue and green lights respectively so that white color is prepared by adjusting color balances among the three colors of red, blue and green.

However, the above-mentioned proposed technique forms a single fluorescent material film in which four fluorescent materials of red, orange, blue and green colors are mixed and dispersed is formed to provide white color; consequently, it is very difficult to adjust balances among the respective light emission colors, while light properties, such as a reflecting property and a progressing property, caused by differences in light wavelengths are taken into consideration.

SUMMARY OF THE INVENTION

The present invention has been devised to solve the above-mentioned conventional problems, and its objective is to provide a white color semiconductor light emitting device which easily provides white color light having high color rendering properties (complete white color light that is free from cloud).

The present invention provides a semiconductor light emitting device that includes an ultraviolet ray emitting element, a blue color converting layer containing a blue color light emitting fluorescent material that is excited by ultraviolet rays and emits blue light, a green color converting layer containing a green color light emitting fluorescent material that is excited by ultraviolet rays and emits green light and a red color converting layer containing a red color light emitting fluorescent material that is excited by ultraviolet rays and emits red light, and in this arrangement, the device is characterized in that the blue color converting layer, the green color converting layer and the red color converting layer are stacked on the ultraviolet ray emitting element in this order.

Here, in order to obtain white color that exerts high color rendering properties, the average particle sizes of the fluorescent materials are preferably made greater in the order of the blue color light emitting fluorescent material, the green color light emitting fluorescent material and the red color light emitting fluorescent material.

In this case, the average particle size of the blue color light emitting fluorescent material is preferably set in a range from 1 to 5 µm, the average particle size of the green color light emitting fluorescent material is preferably set in a range from 10 to 20 µm, and the average particle size of the red color light emitting fluorescent material is preferably set in a range from 30 to 50 µm, respectively.

DETAILED DESCRIPTION OF THE INVENTION

The inventor of the present invention has studied hard to obtain a white color semiconductor light emitting device which can easily adjust color balances of red, blue and green colors and exert high color rendering properties, and have found that an arrangement in which an ultraviolet ray light emitting element which has substantially an emission peak at 380–405 nm in wavelength, is used as a semiconductor light emitting element, and fluorescent material layers respectively containing a blue color light emitting fluorescent material, a green color light emitting fluorescent material and a red color light emitting fluorescent material being stacked on the ultraviolet ray light emitting element in this order, thereby achieving the above-mentioned objectives; thus, the present invention has been devised.

In other words, the present invention is mainly characterized in that a red color converting layer, which color has longer wavelength and is susceptible to reflection and refraction, is placed on the outside, and a blue color converting layer for providing blue light that has shorter wavelength and a higher progressing property is placed on the light emitting element side; thus, color balances of light rays released from the semiconductor light emitting device can be easily adjusted.

Figure 1:
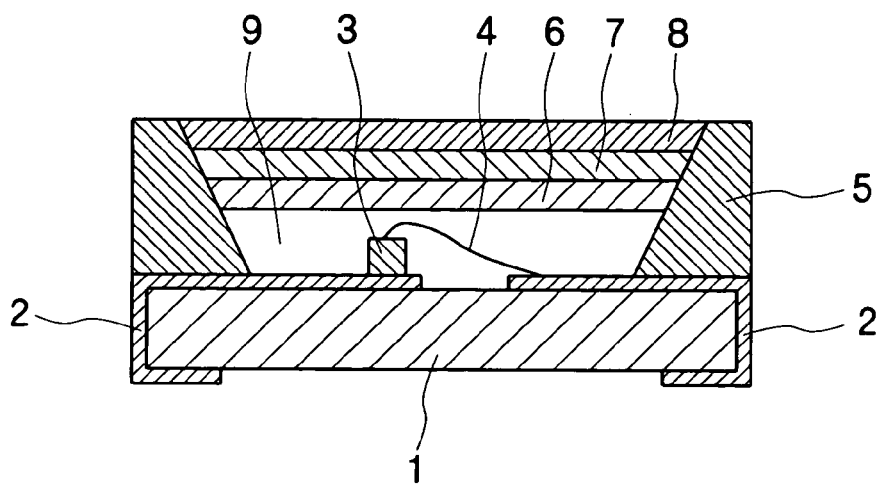
FIG. 1 is a side cross-sectional view that shows one example of a chip-type semiconductor light emitting device in accordance with the present invention.

Referring to figures, the following description discusses a semiconductor light emitting device of the present invention. FIG. 1 shows a cross-sectional view of a chip-type semiconductor light emitting device that is one embodiment of the present invention. A reflection case 5 is attached to a chip substrate 1 in a manner so as to surround an ultraviolet ray light emitting element 3 on the peripheral edge of the upper face of the chip substrate 1. Terminal electrodes 2 and 2' are formed on both ends of the chip substrate 1, and the ultraviolet ray light emitting element (U-LED) 3 is installed on one of the terminal electrodes 2, with one of the electrodes of the light emitting element 3 being connected thereto, and the upper surface electrode (not shown) of the light emitting element 3 is connected to the other terminal electrode 2' through a bonding wire 4. Moreover, on an inner area surrounded by the reflection case 5, a buffer layer 9 made of a light transmitting resin, a blue color converting layer 6 formed by dispersing and mixing a blue color light emitting fluorescent material 61 (shown in FIG. 2) in a light transmitting resin, a green color converting layer 7 formed by dispersing and mixing a green color light emitting fluorescent material 71 (shown in FIG. 2) in a light transmitting resin and a red color converting layer 8 formed by dispersing and mixing a red color light emitting fluorescent material 81 (shown in FIG. 2) in a light transmitting resin are stacked in this order. Here, in the semiconductor light emitting device of FIG. 1, a light emitting element (U-LED) 3 is sealed by the buffer layer 9; however, in place of the buffer layer 9, the blue color converting layer 6 may be used for sealing the light emitting element 3. Moreover, a protective layer and the like may be placed on the upper surface of the red color converting layer 8 on demand.

In the semiconductor light emitting device of this type, for example, a heat-curable light transmitting resin in which a fluorescent material is preliminarily dispersed and mixed is poured into the reflection case 5, and this is heated and cured to form a light emitting layer, and this process is repeatedly carried out to prepare the device.

In the semiconductor light emitting device of FIG. 1, when ultraviolet rays are emitted from the ultraviolet ray light emitting element 3, the ultraviolet rays are first absorbed by the blue color light emitting fluorescent material 61 to emit blue light. Since blue light exerts a superior progressing property, this blue light passes through the green color converting layer 7 and the red color converting layer 8, and is released outside the device. Next, the ultraviolet rays that have passed through the blue color converting layer 6 are absorbed by the green color light emitting fluorescent material 71 to emit green light. Since green light exerts a sufficient progressing property to pass through the red color converting layer 8 on the green color converting layer 7, although it is inferior to blue light, this green light is allowed to pass through the red color converting layer 8 and released outside the device. Then, ultraviolet rays that have passed through the blue color converting layer 6 and the green color converting layer 7 are absorbed by red color light emitting fluorescent material 81 to emit red light. Although red light has a poor progressing property, the red color converting layer 8 is placed as the outer-most layer so that this red light is released outside the device with minimum reflectance and refractive index. Blue, green and red lights thus released outside the device are mixed with a desired color balance so that it is possible to obtain white light that has high color rendering properties.

Since it is difficult to obtain a red light emission with high luminance through excitation by ultraviolet rays, the adjustments on the color balance are preferably carried out based upon red light. In other words, more practically, based upon the light emitting state of the red light, the light emitting states of blue light and green light are adjusted to form desired white light.

In order to obtain a red light emission with high luminance, the content of the fluorescent material can be increased; however, the increased content of the fluorescent material causes an increase in the diffusion rate of red light, resulting in a reduction in the light outputting rate to the outside of the device. Therefore, the inventors of the present invention have studied hard to obtain a red light emission with high luminance without causing a reduction in the light outputting rate, and have found that it is possible to increase the luminance by increasing the particle size of the fluorescent material without the necessity of increasing the content. Although varied depending on the kinds and contents thereof, the red color light emitting fluorescent material preferably has an average particle size (in diameter) in a range from 30 to 50 μm in general. Moreover, the red color light emitting fluorescent material preferably has a content of 30 to 50 wt % with respect to the fluorescent material layer.

Figure 2:
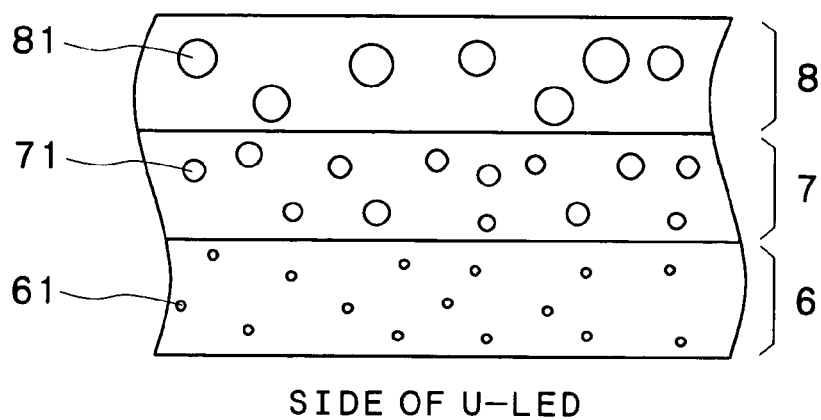
FIG. 2 is an enlarged side cross-sectional view that shows a state of each of light emitting layers of the chip-type semiconductor light emitting device of FIG. 1.

In the same manner, with respect to the green color light emitting fluorescent material and the blue color light emitting fluorescent material, preferable average particle size and content are determined based upon the relationship between the light out putting rate and luminance. With respect to the green color light emitting fluorescent material, the average particle size (in diameter) is set in a range from 10 to 20 μm with the content being set in a range from 5 to 15 wt %. With respect to the blue color light emitting fluorescent material, the average particle size (in diameter) is set in a range from 1 to 5 μm, with the content being set in a range from 10 to 30 wt %. FIG. 2 schematically shows differences in the particle sizes of the fluorescent materials in the respective light emitting layers. The blue color converting layer 6, the green color converting layer 7 and the red color converting layer 8 are stacked in succession from the ultraviolet ray light emitting element side, and the respective fluorescent materials contained in these layers have average particle sizes that are made greater in the order of the blue color light emitting fluorescent material 61, green color light emitting fluorescent material 71 and the red color light emitting fluorescent material 81. With this arrangement, it becomes possible to provide white light that exerts high color rendering properties with high luminance.

With respect to the ultraviolet ray light emitting element to be used in the present invention, not particularly limited, those conventionally known elements may be used. For example, a light emitting element having an active layer made from a GaN-based compound semiconductor may be used.

Moreover, with respect to the blue color light emitting fluorescent material to be used in the present invention, any material may be used as long as it emits blue light upon receipt of ultraviolet rays; and examples thereof include a halophosphate fluorescent material, an aluminate fluorescent material and a silicate fluorescent material. Furthermore, with respect to the activating agent, examples thereof include element such as cerium, europium, manganese, gadolinium, samarium, terbium, tin, chromium and antimony. Among these, europium is preferably used. The added amount of the activating agent is preferably set in a range from 0.1 to 10 mol % with respect to the fluorescent material.

With respect to the green color light emitting fluorescent material, not particularly limited, any material may be used as long as it absorbs ultraviolet rays and emits green light. Examples of the fluorescent material that absorbs ultraviolet rays and emits green light include alkaline earth aluminate fluorescent materials activated by divalent manganese and europium as well as rare earth silicate fluorescent materials activated by trivalent terbium and cerium.

With respect to the red color light emitting fluorescent material, not particularly limited, any material may be used as long as it absorbs ultraviolet rays and emits red light. Examples of the fluorescent material that absorbs ultraviolet rays and emits red light include yttrium oxide activated by europium and composite oxides thereof as well as fluoride fluorescent materials activated by europium.

Figure 3:
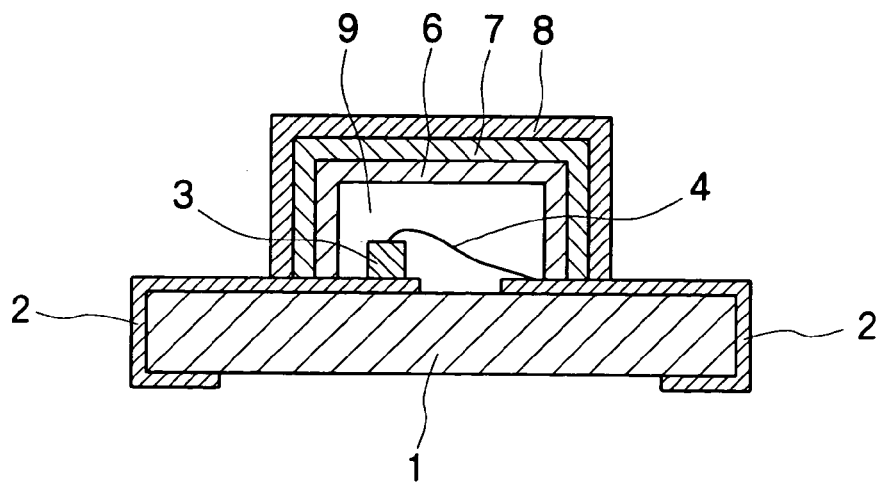
FIG. 3 is a side cross-sectional view that shows another example of a chip-type semiconductor light emitting device in accordance with the present invention.

FIG. 3 shows a semiconductor light emitting device in accordance with another embodiment of the present invention. The semiconductor light emitting device of FIG. 3 is a so-called mold type device without having a reflection cover. In this semiconductor light emitting device, a blue color converting layer 6, a green color converting layer 7 and a red color converting layer 8 are stacked and formed in a manner so as to cover an ultraviolet ray light emitting element 3. In the same manner as the device shown in FIG. 1, in this semiconductor light emitting device also, ultraviolet rays, emitted from the ultraviolet ray light emitting element 3, are absorbed by a blue color light emitting fluorescent material 61, a green color light emitting fluorescent material 71 and a red color light emitting fluorescent material 81 respectively so that blue light, green light and red light are emitted therefrom; thus, by adjusting the color balance of these lights having three colors, released outside the device, it becomes possible to obtain white color having high color rendering properties.

The above-mentioned semiconductor light emitting device is manufactured, for example, in the following manner. First, four surrounding members, which have different sizes and surround the light emitting element 3 and the bonding wire 4, are prepared, and the smallest surrounding member is attached onto a chip substrate 1 in a manner so as to surround the light emitting element 3 and the bonding wire 4. Further, a light transmitting heat-curable resin, which forms a buffer layer 9, is poured to the inside of the surrounding member, and the resin is then heated and cured to form the buffer layer 9. Next, the above-mentioned surrounding member is removed, and another surrounding member, which is wider by one size and form a predetermined gap from the circumferential wall of the buffer layer 9, is attached to the chip substrate 1. Then, a light transmitting resin in which the blue color light emitting fluorescent material 61 has been mixed and dispersed is poured inside the surrounding member so that this resin is heated and cured to form a blue color converting layer 6. In the same manner, by using further another surrounding member that is wider by one size in succession, a green color converting layer 7 and a red color converting layer 8 can be formed.

Figure 4:
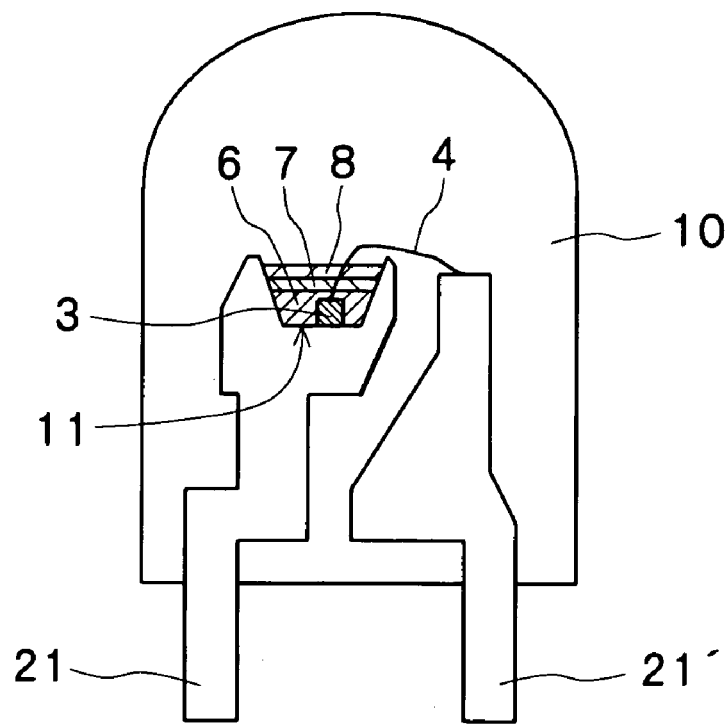
FIG. 4 is a side cross-sectional view that shows one example of a lead-type semiconductor light emitting device in accordance with the present invention.

Moreover, the semiconductor light emitting device of the present invention may be prepared as a lead-type semiconductor light emitting device. In the lead-type semiconductor light emitting device of FIG. 4, an ultraviolet ray light emitting element 3 is secured to a bottom face of a recessed portion (stem) 11 formed on one end face of one of leads 21, and the upper face electrode (not shown) of the ultraviolet ray light emitting element 3 is connected to the upper end of the other lead 21' through a bonding wire 4. Further, a blue color converting layer 6, a green color converting layer 7 and a red color converting layer 8 are stacked and formed in this order on the inside of the stem 11 having a cone shape. The upper portions of the leads 21 and 21', the ultraviolet ray light emitting element 3 and the bonding wire 4 are sealed by a sealing member 10 made of a light transmitting resin. With respect to the mechanism for emitting white light, the semiconductor light emitting device of this type has the same mechanism as the aforementioned chip-type device.

Figure 5:
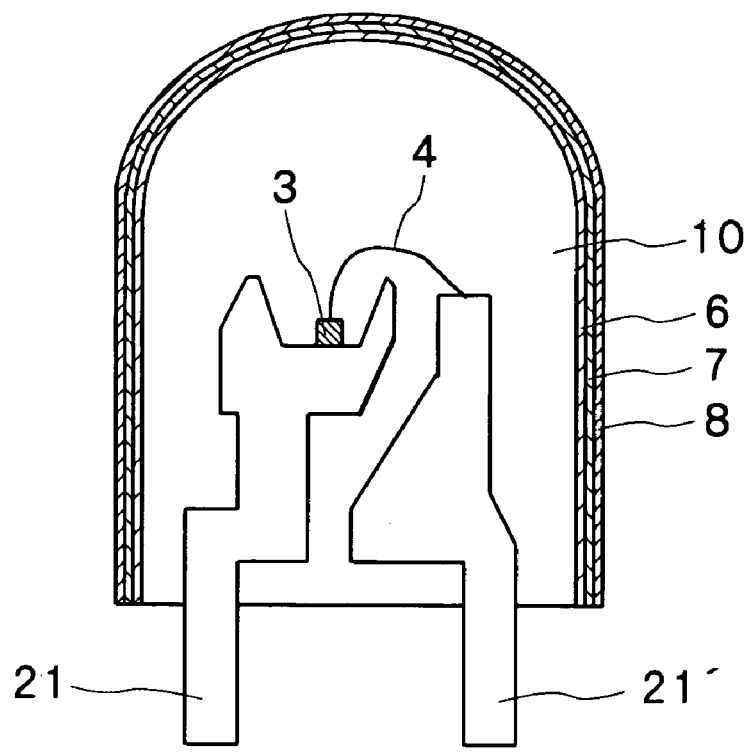
FIG. 5 is a side cross-sectional view that shows another example of a lead-type semiconductor light emitting device in accordance with the present invention.

With respect to the structure of the light emitting layer in the lead-type semiconductor, not particularly limited, any structure may be used as long as it transmits all the lights emitted from the ultraviolet ray light emitting element. For example, as shown in FIG. 5, an arrangement in which color converting layers 6, 7 and 8 are stacked on the peripheral surface of the sealing member 10 may be used. Here, in the case of this embodiment, resins in which fluorescent materials that emit the lights of respective colors are mixed and dispersed may be applied to the peripheral surface of the sealing member 10 to form the color converting layers 6, 7 and 8, or the resin frames in which the above-mentioned fluorescent materials are mixed and dispersed may be preliminarily formed and covered so as to fit to the shape of the peripheral shape of the sealing member 10.

The semiconductor light emitting device of the present invention has an arrangement in which an ultraviolet ray emitting element, a blue color converting layer containing a blue color light emitting fluorescent material that is excited by ultraviolet rays and emits blue light, a green color converting layer containing a green color light emitting fluorescent material that is excited by ultraviolet rays and emits green light and a red color converting layer containing a red color light emitting fluorescent material that is excited by ultraviolet rays and emits red light are stacked on the ultraviolet ray light emitting element; thus, it becomes possible to easily obtain white light having high light rendering properties.

Preferably, the average particle sizes of the fluorescent materials are made greater in the order of the blue color light emitting fluorescent material, the green color light emitting fluorescent material and the red color light emitting fluorescent material; thus, it becomes possible to obtain white light having higher color rendering properties. The average particle size of the blue color light emitting fluorescent material is preferably set in a range from 1 to 5 µm, the average particle size of the green color light emitting fluorescent material is preferably set in a range from 10 to 20 µm, and the average particle size of the red color light emitting fluorescent material is preferably set in a range from 30 to 50 µm, respectively.

Although preferred examples have been described in some detail it is to be understood that certain changes can be made by those skilled in the art without departing from the spirit and scope of the invention as defined by the appended claims.

What is claimed is:

1. A semiconductor light emitting device comprising:
   an ultraviolet ray light emitting element;
   a blue color converting layer containing a blue color light emitting fluorescent material having an average particle size in a range from 1 to 5 µm and that is excited by ultraviolet rays and emits blue light;
   a green color converting layer containing a green color light emitting fluorescent material that is excited by ultraviolet rays and emits green light; and
   a red color converting layer containing a red color light emitting fluorescent material that is excited by ultraviolet rays and emits red light;
   wherein the blue color converting layer, the green color converting layer and the red color converting layer are stacked on the ultraviolet ray light emitting element in this order.

2. The semiconductor light emitting device according to claim 1, wherein average particle sizes of the fluorescent materials are made greater in the order of the blue color light emitting fluorescent material, the green color light emitting fluorescent material and the red color light emitting fluorescent material.

3. The semiconductor light emitting device according to claim 1, wherein the red color light emitting fluorescent material has an average particle size in a range from 30 to 50 µm.

4. The semiconductor light emitting device according to claim 3, wherein the green color light emitting fluorescent material has an average particle size in a range from 10 to 20 μm.

5. The semiconductor light emitting device according to claim 1, wherein the ultraviolet ray light emitting element has substantially an emission peak at 380–405 nm in wavelength.

6. A semiconductor light emitting device according to claim 1, further comprising:
a substrate; and
a pair of terminal electrodes that are placed on both ends of the substrate;
wherein the ultraviolet ray light emitting element has at least two electrodes, the electrodes being electrically connected to the pair of terminal electrodes.

7. The chip-type semiconductor light emitting device according to claim 6,
further comprising a reflection case that is placed on an upper surface of the substrate so as to surround the ultraviolet ray light emitting element,
wherein the blue color converting layer, the green color converting layer and the red color converting layer are provided inside the reflection case.

8. A semiconductor light emitting device according to claim 1, further comprising a pair of leads wherein the ultraviolet ray light emitting element is placed on a bottom face of a recessed section formed on an upper end face of one of the paired leads, with a pair of electrodes thereof being electrically connected to the pair of leads.

9. The semiconductor light emitting device according to claim 8, wherein the blue color converting layer, the green color converting layer and the red color converting layer are placed inside the recessed section, and tip portions of the paired leads are sealed with a sealing member made of a light transmitting resin.

10. The semiconductor light emitting device according to claim 8, wherein the paired leads have tip portions sealed with a sealing member made of a light transmitting resin, and the blue color converting layer, the green color converting layer and the red color converting layer are formed on the periphery of the sealing member.

11. A semiconductor light emitting device comprising:
an ultraviolet ray light emitting element;
a blue color converting layer containing a blue color light emitting fluorescent material that is excited by ultraviolet rays and emits blue light;
a green color converting layer containing a green color light emitting fluorescent material that is excited by ultraviolet rays and emits green light; and
a red color converting layer containing a red color light emitting fluorescent material having an average particle size in a range from 30 to 50 μm that is excited by ultraviolet rays and emits red light,
wherein the blue color converting layer, the green color converting layer and the red color converting layer are stacked on the ultraviolet ray light emitting element in this order.

12. A semiconductor light emitting device according to claim 11, further comprising:
a substrate; and
a pair of terminal electrodes that are placed on both ends of the substrate;
wherein the ultraviolet ray light emitting element has at least two electrodes, the electrodes being electrically connected to the pair of terminal electrodes.

13. A semiconductor light emitting device according to claim 11, further comprising a pair of leads, wherein the ultraviolet ray light emitting element is placed on a bottom face of a recessed section formed on an upper end face of one of the pair of leads, with a pair of electrodes thereof being electrically connected to the pair of leads.

14. A semiconductor light emitting device comprising:
an ultraviolet ray light emitting element;
a blue color converting layer containing a blue color light emitting fluorescent material that is excited by ultraviolet rays and emits blue light;
a green color converting layer containing a green color light emitting fluorescent material having an average particle size in a range from 10 to 20 μm that is excited by ultraviolet rays and emits green light; and
a red color converting layer containing a red color light emitting fluorescent material that is excited by ultraviolet rays and emits red light,
wherein the blue color converting layer, the green color converting layer and the red color converting layer are stacked on the ultraviolet ray light emitting element in this order.

15. A semiconductor light emitting device according to claim 14, further comprising:
a substrate; and
a pair of terminal electrodes that are placed on both ends of the substrate;
wherein the ultraviolet ray light emitting element has at least two electrodes, the electrodes being electrically connected to the pair of terminal electrodes.

16. A semiconductor light emitting device according to claim 14, further comprising a pair of leads, wherein the ultraviolet ray light emitting element is placed on a bottom face of a recessed section formed on an upper end face of one of the pair of leads, with a pair of electrodes thereof being electrically connected to the pair of leads.

* * * * *